(12) United States Patent
Lasserre et al.

(10) Patent No.: US 8,633,082 B2
(45) Date of Patent: Jan. 21, 2014

(54) METHOD FOR FABRICATING HIGH-GAIN MOSFETS WITH ASYMMETRIC SOURCE/DRAIN DOPING FOR ANALOG AND RF APPLICATIONS

(75) Inventors: Sebastien Lasserre, Grenoble (FR); John J. Pekarik, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 41 days.

(21) Appl. No.: 13/302,432

(22) Filed: Nov. 22, 2011

(65) Prior Publication Data

US 2012/0129309 A1  May 24, 2012

(30) Foreign Application Priority Data

Nov. 23, 2010 (FR) .................................... 10 306287

(51) Int. Cl.
*H01L 21/336* (2006.01)
*H01L 21/8238* (2006.01)

(52) U.S. Cl.
USPC ............................ 438/289; 438/206; 438/286

(58) Field of Classification Search
USPC ........... 438/198, 286, 289, 206; 257/E21.437
See application file for complete search history.

(56) References Cited

U.S. PATENT DOCUMENTS

| 6,027,979 | A  | * | 2/2000  | Wei ................................ 438/305 |
| 6,168,999 | B1 |   | 1/2001  | Xiang et al. |
| 6,255,174 | B1 |   | 7/2001  | Yu |
| 6,667,512 | B1 | * | 12/2003 | Huster et al. .................. 257/328 |
| 7,449,386 | B2 |   | 11/2008 | Lin et al. |
| 2006/0172497 | A1 | * | 8/2006 | Hareland et al. .............. 438/286 |
| 2007/0099386 | A1 |   | 5/2007  | Coolbaugh et al. |
| 2009/0085129 | A1 | * | 4/2009 | Majhi et al. ................... 257/402 |

* cited by examiner

*Primary Examiner* — Walter H Swanson
*Assistant Examiner* — Wilner Jean Baptiste
(74) *Attorney, Agent, or Firm* — Katherine S. Brown; L. Jeffrey Kelly

(57) ABSTRACT

A method of fabrication of an analog, asymmetric Metal-Oxide-Semiconductor-Field-Effect-Transistor (MOSFET) is provided. The method may comprise forming a first gate oriented in a first direction over an active region of a semiconductor substrate, forming a second gate extending perpendicular to the first gate over a second active region, using a dual-directional implant process to form a reduced-HALO doped area on a drain side of the first gate and also for a HALO doped area for the second gate, while the source side of the first gate is covered by a resist. Additionally, the method may comprise forming a HALO doped area on the source side of the first gate using a quad-directional implant process using the mask also used for HALO implants of other digital-logic devices on the substrate, while the drain side of the gate is blocked by a resist.

12 Claims, 6 Drawing Sheets

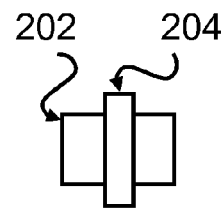
(a)
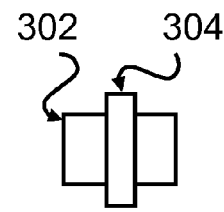
(a)
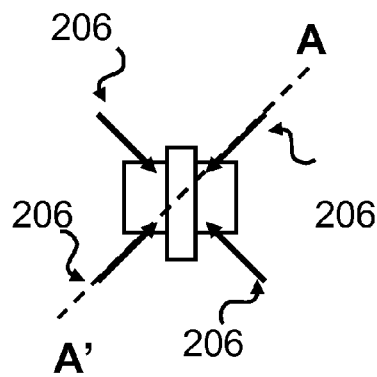
(b)
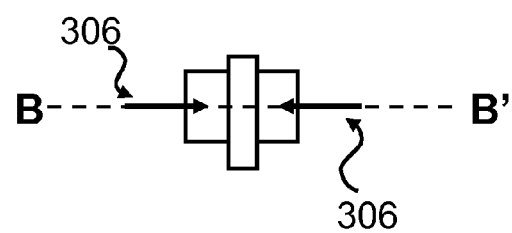
(b)
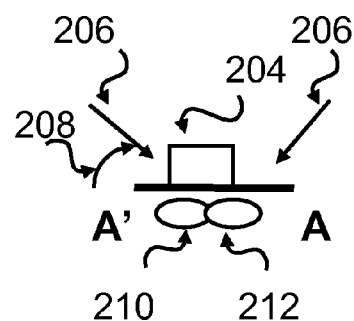
(c)
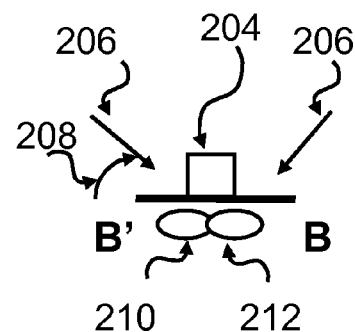
(c)
FIG. 2
FIG. 3

(a)

(b)

(c)

METHOD FOR FABRICATING HIGH-GAIN MOSFETS WITH ASYMMETRIC SOURCE/DRAIN DOPING FOR ANALOG AND RF APPLICATIONS

FIELD OF THE INVENTION

The invention relates generally to a method for fabricating of an analog, asymmetric Metal-Oxide-Semiconductor-Field-Effect-Transistor (MOSFET). In particular, the invention relates to a method of fabricating logic devices, SRAM cells and analog MOSFETs with a reduced set of masks. Additionally, the invention relates to a system adapted to implement the method.

BACKGROUND OF THE INVENTION

Structures of semiconductor devices are becoming smaller and smaller. On one side, there are logic devices, e.g., NAND or NOR gates, and storage devices like SRAM cells (static random access memory). On the other side, there are analog devices. In many cases, it may be required to combine the different types of devices on a single substrate. However, the device characteristics and consequently the fabrication requirements may differ significantly. For example, there may always be a requirement for high gain coefficients of analog transistors.

Typically used HALO implants—also known as pocket implants—may induce potential drain-side barriers that result in anomalously high output conductance of analog FETs (field effect transistor). It turns out that the gain may not be channel length modulated. Thus, longer gates may not exhibit higher gains. This may be a serious limitation for analog applications that may also require SRAM cells as well as other logic gates on the same substrate.

Several approaches have been tried to overcome this limitation.

Document U.S. Pat. No. 6,667,512B1 discloses an asymmetric retrograde HALO metal-oxide semiconductor field-effect transistor (MOSFET) with a gate formed over the substrate defining a channel thereunder in a substrate having a source and a drain side. A retrograde HALO doped area is formed in the source side of the channel using tilted ion implantation. A source and a drain are formed in the substrate adjacent to the source and the drain sides of the channel. The asymmetrical doping arrangement provides the specific level of off-state leakage current without decreasing saturation drive current and trans-conductance.

Document U.S. Pat. No. 6,168,999B1 discloses a method for fabricating a submicron metal-oxide semiconductor field-effect transistor (MOSFET). The method includes providing a gate on a substrate, the substrate having a source side and a drain side. The drain side has a spacer area. The method also includes forming a spacer at a spacer area and performing a HALO implant at the source side and a drain side, wherein the spacer prevents implantation in the spacer area, where the spacer facilitates formation of a lateral asymmetric channel. Also included in the method is forming heavily doped extensions in the source and the drain side, where the spacer prevents doping in the spacer area. Furthermore, the method includes—after removing the spacer—forming a lightly doped extension in the drain side, where the heavily doped extensions and the lightly doped extension prevent hot carrier injection.

Additionally, the document US2007/0099386A1 discloses a method for fabricating high gain FETs that substantially reduces or eliminates unwanted variation in device characteristic caused by using a prior art shadow masking process. The method employs a blocking mask that at least partially extends over the gate region, wherein after extension and HALO implants a FET has an asymmetric HALO region, asymmetric extension regions or a combination thereof.

Therefore, there may be a need for a method for fabricating of an asymmetric analog FET that may be easier, more cost effective and more reliable than existing techniques. This may apply in particular in the context of a fabrication of other devices. Other devices may be logic devices or SRAM cells.

SUMMARY OF THE INVENTION

This need may be addressed by the method for fabricating of an analog, asymmetric Metal-Oxide-Semiconductor-Field-Effect-Transistor (AAFET) according to the independent claim, as well as by a system adapted to implement the method.

In one embodiment, a method of fabrication of an analog, asymmetric MOSFET may be provided. The method may comprise providing a semiconductor substrate with a dielectric, overlying an active region in a first area of the substrate. It may also comprise forming a first gate for the analog, asymmetrical MOSFET along a first direction in a central position over the active region, wherein the first gate may define a channel thereunder in the substrate. The substrate may comprise a source side and a drain side. Furthermore, the method may comprise forming a second gate over another active region for an SRAM cell in a second area of the substrate. The second gate may extend perpendicular to the first gate. Additionally, the method may comprise forming a reduced-HALO doped area on the drain side of the first gate using a dual-directional implant process also used for the SRAM cell for a HALO doped area for the second gate, such that an orientation of a HALO beam for the forming of the reduced-HALO doped area on the drain side of the first gate may be in parallel to a longitudinal or lengthwise orientation of the first gate, while the source side of the first gate may be covered by a resist. Also part of the method may be forming a HALO doped area on the source side of the first gate using a quad-directional implant process using the mask also used for HALO implants of other digital-logic devices on the substrate, while the drain side of the gate is blocked by a resist.

According to another embodiment a system adapted to implement the above described method may be provided. The implementation may be such that at least the digital-logic device, the SRAM cell and the analog, asymmetric Metal-Oxide-Semiconductor-Field-Effect-Transistor may be fabricated using an eight mask fabrication process.

According to another embodiment, the method may comprise forming a source in the substrate adjacent to the source side of the first gate and forming a drain in the substrate adjacent to the drain side of the first gate. The method may also comprise forming a contact on the source or on the drain, or on both, to enable electrical connections to other devices.

In a further embodiment of the method, the forming of a reduced-HALO doped area on the drain side may also comprise forming an extension area on the drain side using the dual-directional implant process, in particular, oriented parallel to the longitudinal side or longitudinal edge of the gate.

In yet another embodiment of the method, the forming of a HALO doped area on the source side also comprises forming an extension area on the source side using the quad-directional implant process.

PRINCIPLE TERMS

In the context of this application, the following principle terms have been used:

Dual-direction implant process—The term dual-direction implant process, also known as dual mode implant, may denote an implant process step, wherein a projection of an ion beam direction may be perpendicular to a longitudinal direction of a device gate, e.g., a MOSFET. Typically, a source and a drain may be fabricated on a first and on a second side of a gate, respectively. For this, implants may be required. If an ion beam direction projection on a surface of a substrate may be oriented perpendicular to a longitudinal or lengthwise direction of the device gate, two ion beam directions may be required, which may have orientations differing by 180°, such that each of the two areas adjacent to the longitudinal sides of the gate may receive the ion implant beam. Thus, two directions may be required for this type of implant step or implant process. Hence, a skilled person speaks of a dual-direction implant process or simply dual mode (compare also FIG. 3).

Quad-direction implant process—The term quad-direction implant process, also known as quad mode implant, may denote an implant process step, wherein a projection of an ion beam direction may not be perpendicular to a longitudinal direction of a device gate, e.g., a MOSFET. Typically, a source and a drain may be fabricated on a first and on a second side of a gate. For this, implants may be required. If an ion beam direction projection on a surface of a substrate may be oriented, e.g., at 45° to a longitudinal direction of the device gate, four ion beam directions may be required, which may have a 90° angle between them, such that each of the two areas adjacent to the longitudinal sides of the gate may receive the ion implant beam from two directions. Thus, four directions may be required for this type of implant step or implant process. Hence, a skilled person speaks of a quad-directional implant process or simply quad mode (compare also FIG. 2).

Gate—The term gate may denote one of three contacts of a field effect transistor (FET). Below the gate, the active region, including the so-called channel, may be located. The gate may have typically a longitudinal extension. Adjacent to one of the longitudinal sides of the gate there may be a source and a related source contact of the FET, whereas on the other longitudinal side of the gate a drain and a related drain contact may be located.

HALO implant—The term HALO implant may denote a special doped area adjacent to the gate. The source-to-substrate and drain-to-substrate junctions of a FET may be an object of much attention in the design of the FET because of three major factors: the design may affect the current-voltage characteristics of the device, it may lower an output resistance, and also influence the speed or frequency characteristics of the device through the loading effect of junction capacitances, and finally, the component of stand-by power dissipation, due to junction leakage may be reduced.

MOSFETs may have extension areas (see below) as well as HALO areas below or adjacent to the gate. In this sense, HALO doping may be an addition of very thin heavily doped regions of the same doping type as the substrate tight against the junction walls to limit the extent of depletion regions. HALO implant may typically be deeper in the substrate than extension areas. Also, reduced-HALO doped areas—in contrast to heavily doped regions—may be common these days.

Extension implant—The term extension implant area may denote areas which may typically be just below the gate on both sides of the gate. On one side, a source side extension may reach into a source area. On the other side, a drain side extension area may reach into a drain area. The extension areas—also junction extensions—have a positive effect on a drain induced barrier lowering of the threshold voltage and channel length modulation effects upon I-V curves.

Mask—The term mask may denote a mask used in a known sense of photolithography steps in the manufacturing of semiconductor devices. A mask set may be a series of electronic data that defines a geometry for the photolithography steps of semiconductor fabrication. Each of the physical masks generated from this data is called a photomask, or in short, a mask.

The aspects defined above and further aspects of the present invention are apparent from the examples of embodiments to be described hereinafter and are explained with reference to the examples of embodiments, but to which the invention is not limited.

BRIEF DESCRIPTION OF THE DRAWINGS

Preferred embodiments of the invention will now be described, by way of example only, and with reference to the following drawings:

b. FIG. 2 illustrates a typical digital device using a quad-directional mode implant.

c. FIG. 3 illustrates another process using a dual-directional mode implant d.

DETAILED DESCRIPTION OF EXEMPLARY EMBODIMENTS

A detailed description of the figures now follows. All illustrations in the figures are schematic.

It should be noted that embodiments of the invention are described with reference to particular subject-matters, such as with reference to method type claims, whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular between features of the method type claims, and features of the apparatus type claims, is considered as to be disclosed within this document.

Figure 1:
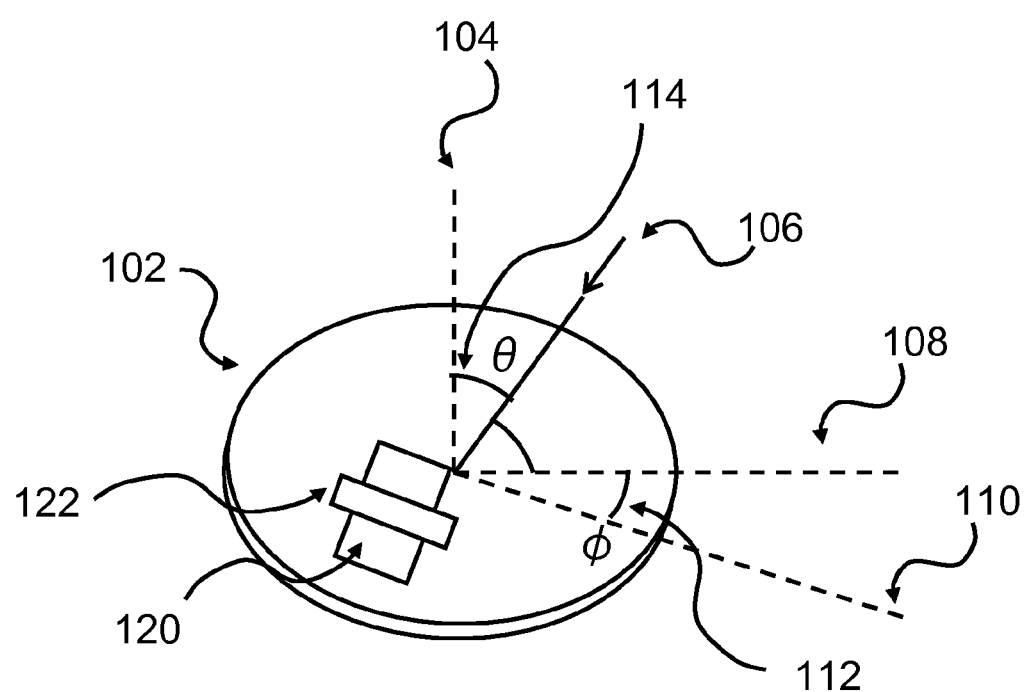
FIG. 1 shows an angle reference model when discussing angled implant processes.

FIG. 1 illustrates a conventional spatial orientation diagram used for angled implants. A substrate 102 can be a silicon wafer. The wafer or substrate may be covered with a dielectric. Arrow 106 may denote an ion implant beam. Dashed line 104 may denote a wafer normal 104. The tilt angle θ 114 may specify the angle between the ion beam direction 116 and the normal vector 104 on the surface of the wafer 102.

The twist angle φ may specify the angle between a wafer notch (not shown) and the vector formed by a projection 108 of the ion beam 116 on the surface.

Dashed line 110 may denote a zero twist angle φ. Zero degree twist may be defined by an ion beam parallel to a lengthy orientation of a gate 122. Block 120 may denote a very much enlarged device. A similar device diagram may be used in the context of FIGS. 2, 3 and 4.

Nowadays, as soon as the tilt angle 114 is not zero, implants may commonly be performed in "quad mode" which consists of a chain of four implants steps, each with one quarter of the dose and each rotated by 90° with respect to the previous one. Thus, if the first implant step is performed under a twist angle 112 of φ1, then the second implant step may be performed under (φ1+90°), the third implant step may be performed under (φ1+180°), and the fourth implant step may be performed under (φ1+270°). Generally, φ1 may be about 45°.

In case of SRAM memory, starting at approximately a 45 nm node, only one "gate" orientation may be allowed to enlarge a lithography process window. This may promote the use of "dual mode" implant consisting of a chain of two implants each with half of the dose leading to increased functionality margin at low operating voltage. In this case, φ1 may be 90° meaning that the twist projection 108 may be normal to a lengthy extension of the gate 222 in the surface of the substrate 102.

FIG. 2 illustrates a typical digital device and its implant process. FIG. 2(a) may be a top view of a device. A substrate area 202 can be covered with a dielectric (not shown) and a gate 204. FIG. 2(b) shows a quad-directional mode implant with an ion beam 206 with φ1=45°. The ion beam 206 may be shown as a projection onto the substrate plane. In FIG. 2(c), a cross section along an axis A-A' in a beam plane perpendicular to the substrate shows the tilt angle θ, 208. The areas 210 and 212 illustrate implant areas, e.g., HALO implants or extension areas.

It may be noted that sidewall spacers on the source and the drain side of the gate of any device may have been formed before the forming of HALO implant areas.

The first orientation of gates for AAFETs may, e.g., be oriented in an east/west direction on a substrate wafer. In such case, the orientation of the SRAM cell may have a north/south orientation on the substrate wafer, and vice versa. Other gates for all other logic devices may either have a north/south or east/west orientation on the wafer.

It may also be clear that a twist angle of a HALO implant for the SRAM cells could be zero. Additionally, it may be mentioned that a sidewall spacers on the source side and the drain side of all gates may be formed before forming any extension or HALO implant areas.

FIG. 3 illustrates another process, wherein the ion beam 306 may be implemented in a dual-directional mode in case of a SRAM cell with a substrate area and a SRAM cell gate 304. Just two beam directions may be used instead of four in the quad-directional mode. The arrows 306 illustrate the ion beam with a twist angle being not 45° turned but 90°, meaning that a projection of the ion beam to the substrate surface may be normal to a lengthy gate orientation as may be seen in FIG. 3(b). FIG. 3(a) illustrates a part of the substrate and the gate. FIG. 3(c) shows how the tilt angle θ may be oriented. This figure also shows a cross section in a beam plane perpendicular to the substrate surface of FIG. 3(b) along the B-B'.

Figure 4:
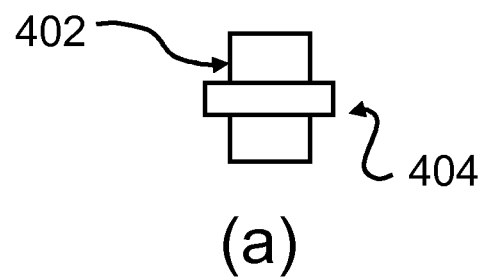
FIG. 4 illustrates another process for a fabrication of an analog asymmetric FET with mixed quad-directional and dual-directional mode implants.
Figure 4:
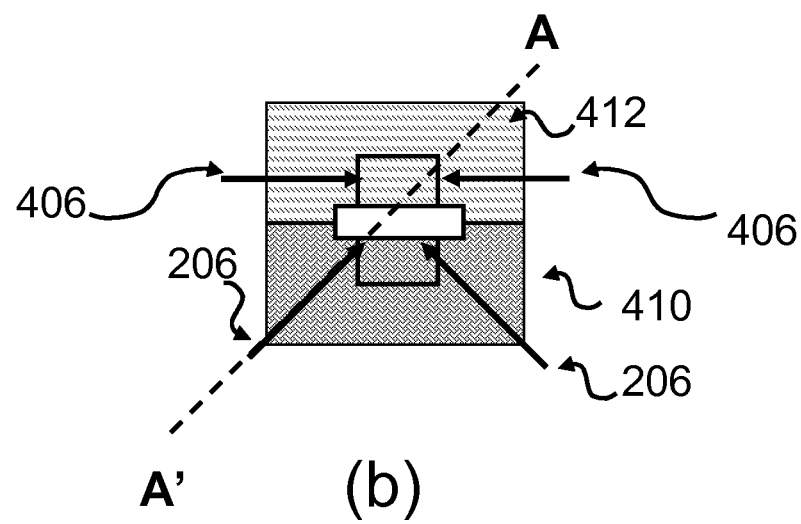
Figure 4:
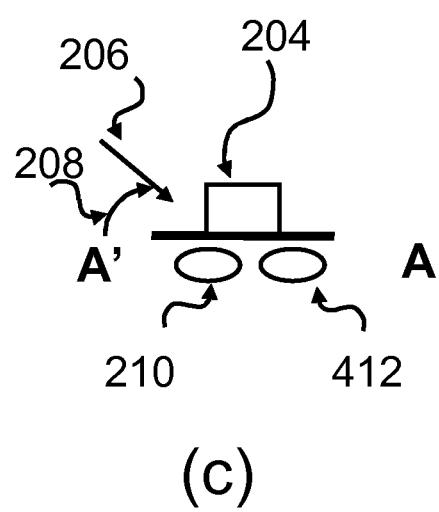

FIG. 4 illustrates another process for a fabrication of an analog asymmetric FET in which two sides of the gate may receive different doping treatments. It should be noted that the device being built out of the substrate area 402 and a gate 404 may be turned by 90 degree in comparison of FIG. 2 and FIG. 3. This "mis-orientation" of an analog device—here the AAFET—in comparison to the SRAM cells may be comprised in one embodiment of the current invention.

FIG. 4(b) shows steps in the fabrication of the AAFET as a mixture of a quad-directional mode and a dual mode implant process step.

The area 410 may be blocked by a resist during the implantation process step of a HALO and an extension implant for the SRAM cell (compare FIG. 2(c)), and the area 412 may be blocked by a resist during the HALO and extension implant processes for other logic devices apart from SRAM cells, e.g., LVT devices (Low Vt), that may also be fabricated on the same wafer or substrate. The left side, shown in FIG. 4(c), may be a source of the AAFET and the opposite side—here the right side of the device—may be a drain side of the AAFET.

FIG. 4(c) shows a cross section along axis A-A' of FIG. 4(b), the cross section also being perpendicular to the substrate surface. Only one side shows a tilt angle of an ion beam. In this case, it may be the ion beam from the quad-directional mode implant process step of the source side. Area 412 shows the asymmetric HALO implant of the dual mode implant process step discussed above. The implant area may be shifted away from an area under the gate in comparison to HALO implant area shown by ellipse 210.

Figure 5:
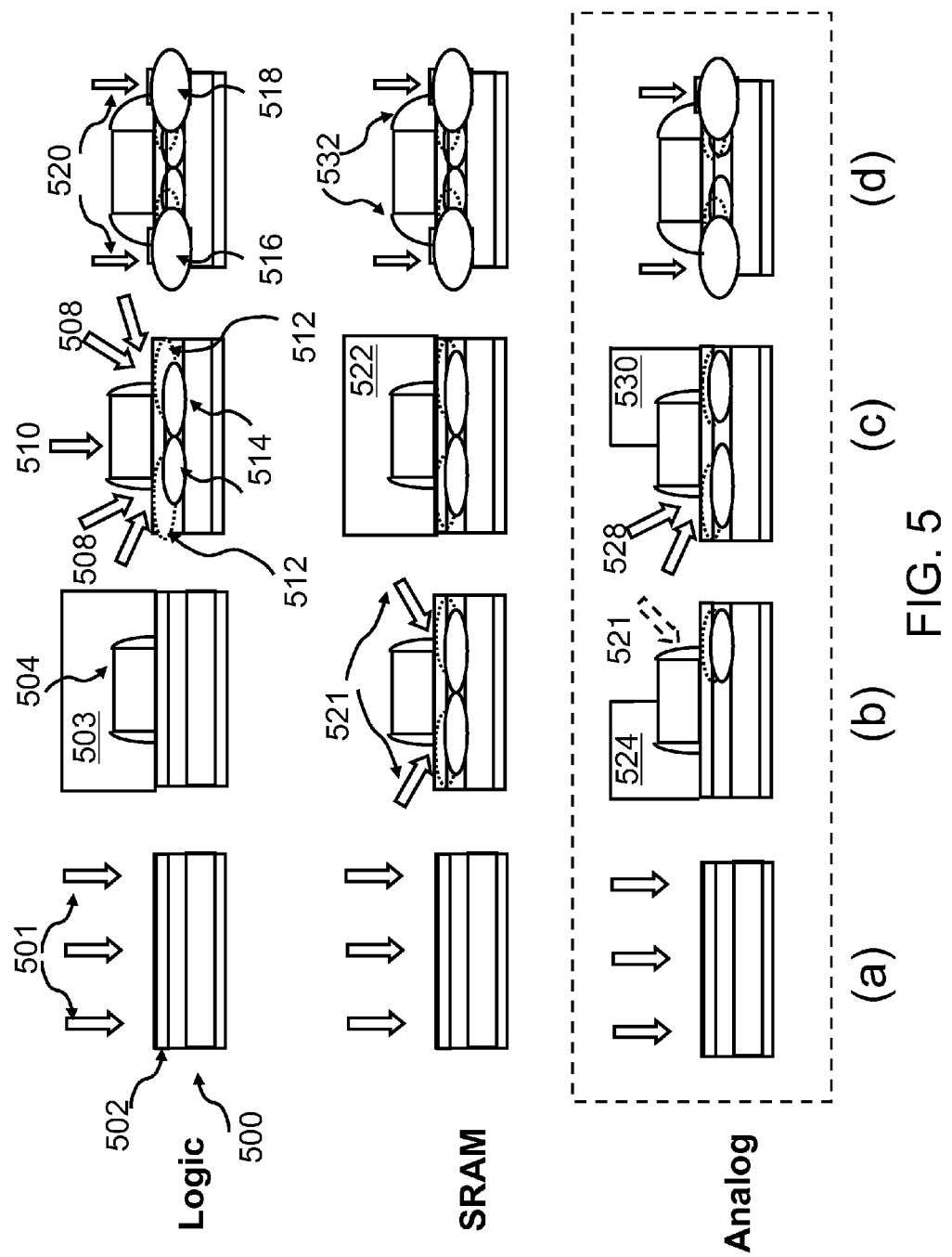
FIG. 5 illustrates 3 device types being fabricated in parallel using the same mask sequence for all three device types.

FIG. 5 shows process steps that may be linked to each other for three different devices on a substrate: a normal logic device, an SRAM, and an AAFET. 500 may represent a typical wafer that may have undergone the conventional steps before devices may be produced thereon. The process steps, which only may represent a subset of process steps, may be shown horizontally for each device. Reference to the individual figures will be made using the device type, i.e., "Logic", "SRAM" and "Analog" and a step coordinate like (a), (b), (c) and (d). Hence, the first step shown for the AAFET may be "analog-(a)".

In step (a), a p-well may be formed by p-type implant indicated by arrows 501. This step may be identical for all three types of devices. Next a gate 504 may be formed. The reference number 504 may only be shown once for all twelve partial figures due to clarity reasons. However, it should be clear to a skilled person that similar graphical elements may symbolize similar physical and geometrical elements. Only in logic-(b), the gate may explicitly be indicated by the arrow related to reference numeral 504. This referral technique may be used throughout FIG. 5. In step (b), the logic device may be covered with a resist 503. No doping may happen to this device in a next step. However, the SRAM device may be doped using a dual-directional implant technique as explained above. A HALO doped area as well as an extension area may be fabricated in this process step. The ion beam may be represented by 521. It should be noted that both sides of the gate—SRAM-(b)—may be exposed to the ion beams 521. Symmetric HALO and extension areas doping may be the result.

During the same process step, the left side of the AAFET—shown in analog-(b)—may be covered with a resist 524, such that the right side of the AAFET may be exposed to the same dual-directional HALO-, and potentially also extension-doping-ion-beam 521 as the SRAM, as shown in SRAM-(b). It should be noted that a projection of the ion beam 521, having a non-zero tilt angle, may be oriented in parallel to a longitudinal side of the gate of the AAFET. For this reason, the ion beam arrow 521 in analog-(b) is shown in a dashed line. The implant beam, which may be a HALO implant beam for the SRAM device, may be blocked by the transistor gate orientation being parallel to the ion beam in AAFET-(b).

In step (c), the logic device may be exposed to ion implant beams 508 used in quad-directional mode for HALO implants 514 as well as ion beam 510 for extension areas 512 doping. Beam 510 may of course be broader than symbolically shown and may cover the complete devices area, or the complete wafer area, respectively. Ion beams 508 may have a non-zero tilt angle to a normal of the substrate. During this step the SRAM may be covered by a resist 522 such that no doping will happen to this device during this process step. The right side of the AAFET may, in this step, also be covered by a resist 530, such that the right side may not receive any doping ions. However, the left side of the gate may not be covered by a resist, such that the left side adjacent to the gate may be exposed to the same HALO and extension implants 528 in quad-directional mode as the logic device. This way, HALO and extension implant may be fabricated with respect to the AAFET device. The left side of the analog device in FIG. 5(c) may represent a source side of the device, while the right side of the analog device in FIG. 5(c) may represent the drain side of the device.

It should also be noted that the gate of the analog device in all four steps shown—(a), (b), (c), (d)—may be rotated by 90° if compared to the gate of the SRAM device. This may be a prerequisite for the feasibility of the inventive method. Thus, no additional mask may be required for fabricating the AAFET together with logic gates and SRAM cell on the same substrate if compared to a conventional process requiring at least one more mask.

Finally, in process step (d), all three device types may be exposed to an N+-Source-Drain doping 520 building source 516 and drain 518 of the devices.

The above-described methods for fabricating of an analog, asymmetric Metal-Oxide-Semiconductor-Field-Effect-Transistor may offer some advantages.

The usage of a specific mask that may conventionally be used only for the fabrication of SRAM cells, also for a production process step of an analog device, in particular, an asymmetric analog FET, may reduce a required number of process steps, i.e., mask steps. This may be because one mask may be used for different purposes with different types of devices at the same time. The different purposes may be a) fabricating a HALO implant area for the SRAM devices and b) fabricating reduced-HALO implant areas for the drain of the asymmetric analog FETs. Thus, a conventional eight mask process may be used to fabricate three different types of devices on one substrate, namely normal digital-logic, or in short, logic devices, SRAM cells as well as analog, asymmetrical FETs (AAFET). This may be a major improvement of the conventional requirement to use an extra mask step for a fabrication of the AAFET. The orientation of the devices may be independent of the analog devices and the SRAM cells. Only the orientation of SRAM cells and the AAFETs have to be 90° to each other. The same may also apply for extension areas. Furthermore, smaller gate length may be possible compared to conventional devices. Also, a better channel control with a source side HALO may be possible.

Additionally, it could be shown that the gain of the AAFET fabricated this way may improve significantly if compared to conventional transistors.

Reducing the number of production steps in a semiconductor fabrication process may strongly be related to reduce cost for the fabrication process. Additionally, the elimination of one or more production steps related to a reduced number of masks may also increase the reliability of a semiconductor production process. Fewer masks and, thus, fewer production steps may reduce the number of potential production errors. Hence, also the reliability of the fabrication process may be increased.

These advantages may also be achieved by a system adapted to implement the method for fabricating of an analog, asymmetric Metal-Oxide-Semiconductor-Field-Effect-Transistor.

This process sequence illustrated in FIG. 5 shows that it may not be required to use an additional mask when AAFETs are part of a fabrication process of mixed device type chips combining logic-, SRAM- and AAFET-devices on one single substrate. An eight implant mask process that may be used for a fabrication of SRAM cells may also be used for fabricating of such a mix of devices. The embodiment of the claimed method is indicated in FIG. 5. A skilled person will understand that the same sequence of mask steps may be implemented using p-type or n-type devices.

As an embodiment of the eight mask process, the following example used for n- or p-type digital and SRAM devices for CMOS technology may be given:

Bare silicon p-type doped may be used as a substrate material.

An NWELL mask may define an active silicon area where n-type dopants may be implanted in chained implants known as deep well implants. Additionally, so called Vt implants for p-type transistors may be done.

A PWELL mask may define active silicon area where p-type dopants may be implanted in chained implants known as deep well implants. Additionally, so called adjust Vt implants for n-type transistors may be done.

In a next step, gates may be formed. Next, a first spacer formation may be performed. After this, four masks may be applied:

An SRAM_NLDD mask may define a resist opening for extension and HALO implants—in dual mode—for n-type SRAM transistors, in particular, for pull down devices for the SRAM cells.

Next, an SRAM_PLDD mask may define resist openings for extension and HALO implants—in dual mode—for p-type SRAM transistors, in particular, for pull-up devices for the SRAM cells.

After this, an LVT_NLDD mask may define resist openings for extensions and HALO implants—in quad-directional mode—for n-type digital transistors to be referred to as LVt.

Next, an LVT_PLDD mask may define resist openings for extension and HALO implants—in quad-directional mode—for p-type digital transistors to be referred to as LVt or logic devices.

Then, a second spacer formation may be performed, after which an NSD mask may be done, which may be used to define source and drain for n-type transistors using n-type implants.

Finally, a PSD mask may be used to define source and drain for p-type transistors using p-type implants.

Figure 6:
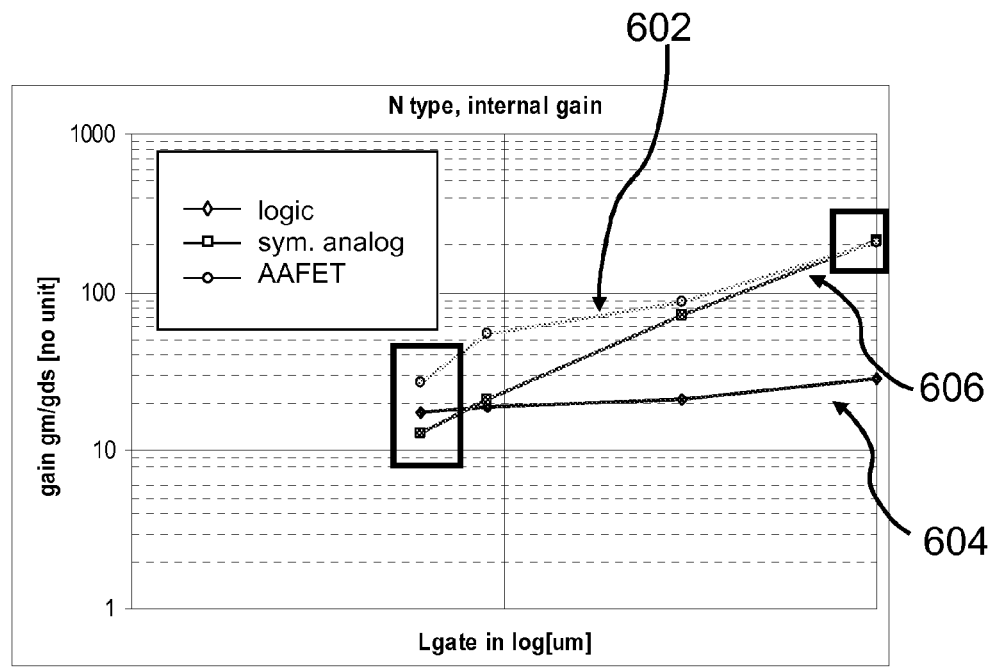
FIG. 6 shows an internal gain diagram for different types of devices including an AAFET fabricated according to the inventive method.
Figure 7:
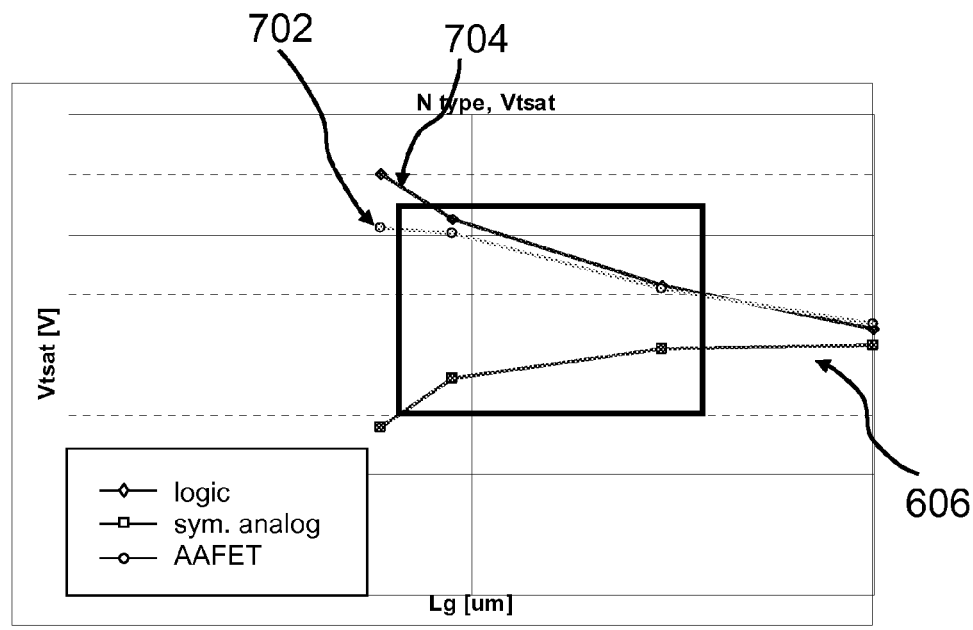
FIG. 7 shows Vtsat vs. a gate length of different types of devices.

Results of the method used are shown in FIG. 6 and FIG. 7. FIG. 6 shows simulation results using a 28 nm technology deck showing benefits of the AAFET device. Graphs 602 and 702 illustrate the result for the AAFET fabricated according to the above mentioned process. A better internal gain (Gm/GdS) for short channel implementations compared to typical digital, respectively digital-logic devices—graphs 604 and 704 representing logic devices—can clearly be recognized. For long channel implementations, the AAFET shows equivalent gain if compared to symmetrically doped devices indicated by graphs 606 and 706 (sym. analog). FIG. 7 shows Vtsat in volts on the y-axis and the gate length in μm on the x-axis.

A skilled person will also recognize a better channel control down to smaller dimensions if compared to symmetric analog devices represented by 606 in FIG. 7. It may be noted that the same results may be obtained for N-tape and p-type devices.

Figure 8:
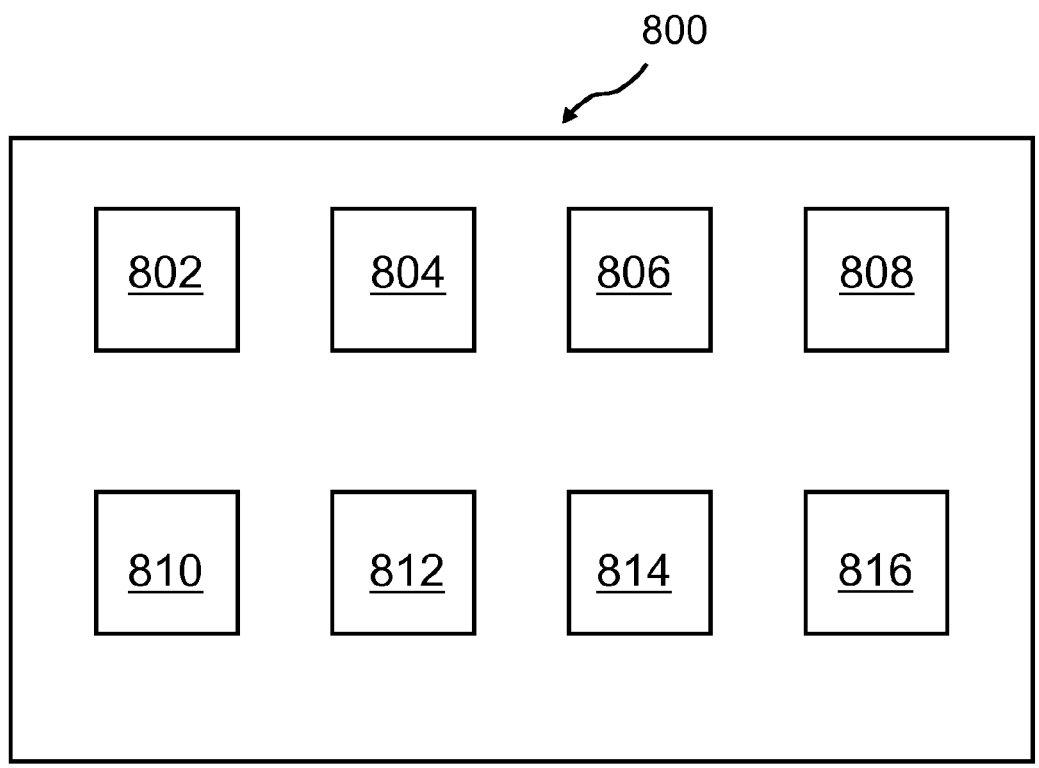
FIG. 8 shows the inventive system.

FIG. 8 shows in a schematic way a system 800 adapted to implement the inventive method. The system 800 may use eight masks 802, 804, 806, 808, 810, 812, 814, 816 for a fabrication of all three different device types as mentioned above.

While the invention has been described with respect to a limited number of embodiments, those skilled in the art having benefit of this disclosure, will appreciate that other embodiments can be devised, which do not depart from the scope of the invention as disclosed herein. Accordingly, the scope of the invention should be limited only by the attached claims.

It should also be noted that the term "comprising" does not exclude other elements or steps and "a" or "an" does not exclude a plurality. On the other side, the term "comprising" may also include the case of "consisting of". Also, elements described in association with different embodiments may be combined. It should also be noted that reference signs in the claims should not be construed as limiting elements.

The invention claimed is:

1. A method of fabrication of an analog, asymmetric Metal-Oxide-Semiconductor-Field-Effect-Transistor (MOSFET) comprising:
   providing a semiconductor substrate with a dielectric, overlying an active region in a first area of the substrate,
   forming a first gate for the analog, asymmetrical MOSFET along a first direction in a central position over the active region, wherein the first gate defines a channel thereunder in the substrate comprising a source side and a drain side,
   forming a second gate over another active region of the substrate for an SRAM cell in a second area of the substrate, the second gate extending perpendicular to the first gate,
   forming a reduced-HALO doped area on the drain side of the first gate using a dual-directional implant process also used for the SRAM cell for a HALO doped area for the second gate, such that an orientation of a HALO beam for the forming of the reduced-HALO doped area on the drain side of the first gate is in parallel to a longitudinal orientation of the first gate, while the source side of the first gate is covered by a first resist, and
   forming a HALO doped area on the source side of the first gate using a quad-directional implant process using a mask also used for HALO implants of other digital-logic devices on the substrate, while the drain side of the gate is blocked by a second resist.

2. The method according to claim 1, comprising forming a source in the substrate adjacent to the source side of the first gate and forming a drain in the substrate adjacent to the drain side of the first gate.

3. The method according to claim 2, comprising forming a source contact on the source.

4. The method according to claim 2, comprising forming a drain contact on the drain.

5. The method according to claim 2, wherein the forming the reduced-HALO doped area on the source side also comprises
   forming an extension area on the source side using the quad-directional implant process.

6. The method according to claim 1, comprising forming a source contact on a source.

7. The method according to claim 1, comprising forming a drain contact on a drain.

8. The method according to claim 1, wherein the forming the reduced-HALO doped area on the drain side also comprises
   forming an extension area on the drain side using the dual-directional implant process.

9. The method according to claim 8, wherein the forming the reduced-HALO doped area on the source side also comprises
   forming an extension area on the source side using the quad-directional implant process.

10. The method according to claim 1, wherein the forming the reduced-HALO doped area on the source side also comprises
    forming an extension area on the source side using the quad-directional implant process.

11. The method according to claim 1, comprising a formation of sidewall spacers on sidewalls of the first gate and second gate.

12. A system adapted to implement the method according to claim 1, such that at least the SRAM cell and the analog, asymmetric Metal-Oxide-Semiconductor-Field-Effect-Transistor are fabricated using an eight mask fabrication process.

* * * * *